United States Patent
Rachmady et al.

(10) Patent No.: US 11,659,722 B2
(45) Date of Patent: May 23, 2023

(54) THIN-FILM-TRANSISTOR BASED COMPLEMENTARY METAL-OXIDE-SEMICONDUCTOR (CMOS) CIRCUIT

(71) Applicant: Intel Corporation, Santa Clara, CA (US)

(72) Inventors: Willy Rachmady, Beaverton, OR (US); Prashant Majhi, San Jose, CA (US); Ravi Pillarisetty, Portland, OR (US); Elijah Karpov, Portland, OR (US); Brian Doyle, Portland, OR (US); Anup Pancholi, Hillsboro, OR (US); Abhishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 16/226,209

(22) Filed: Dec. 19, 2018

(65) Prior Publication Data

US 2020/0203432 A1 Jun. 25, 2020

(51) Int. Cl.
*H10K 19/20* (2023.01)
*H01L 27/12* (2006.01)
(Continued)

(52) U.S. Cl.
CPC .......... *H01L 27/286* (2013.01); *H01L 27/124* (2013.01); *H01L 27/1218* (2013.01);
(Continued)

(58) Field of Classification Search
CPC ............... H01L 27/283; H01L 27/1218; H01L 27/1225; H01L 27/124; H01L 27/286;
(Continued)

(56) References Cited

U.S. PATENT DOCUMENTS

| 2014/0152383 A1 | 6/2014 | Nikonov | |
| 2016/0013316 A1* | 1/2016 | Kuang | H01L 21/02639 |
| | | | 257/190 |

(Continued)

OTHER PUBLICATIONS

European Extended Search Report for European Patent Application No. 19209844.0 dated Apr. 23, 2020, 9 pgs.
(Continued)

*Primary Examiner* — Andres Munoz
(74) *Attorney, Agent, or Firm* — Schwabe, Williamson & Wyatt, P.C.

(57) ABSTRACT

Embodiments herein describe techniques for a semiconductor device including a semiconductor substrate, a first device of a first wafer, and a second device at back end of a second wafer, where the first device is bonded with the second device. A first metal electrode of the first device within a first dielectric layer is coupled to an n-type oxide TFT having a channel layer that includes an oxide semiconductor material. A second metal electrode of the second device within a second dielectric layer is coupled to p-type organic TFT having a channel layer that includes an organic material. The first dielectric layer is bonded to the second dielectric layer, and the first metal electrode is bonded to the second metal electrode. The n-type oxide TFT and the p-type organic TFT form a symmetrical pair of transistors of a CMOS circuit. Other embodiments may be described and/or claimed.

21 Claims, 10 Drawing Sheets

(51) Int. Cl.
  *H01L 27/28* (2006.01)
  *H01L 29/66* (2006.01)
  *H01L 29/786* (2006.01)
  *H01L 51/05* (2006.01)
  *H01L 51/10* (2006.01)

(52) U.S. Cl.
  CPC ........ *H01L 27/1225* (2013.01); *H01L 27/283* (2013.01); *H01L 29/66969* (2013.01); *H01L 29/7869* (2013.01); *H01L 29/78696* (2013.01); *H01L 51/0558* (2013.01); *H01L 51/102* (2013.01)

(58) Field of Classification Search
  CPC ........... H01L 29/66969; H01L 29/7869; H01L 29/78696; H01L 51/0558; H01L 51/102; H01K 19/10; H01K 19/20; H01K 10/484; H01K 10/82
  See application file for complete search history.

(56) References Cited

U.S. PATENT DOCUMENTS

| | | |
|---|---|---|
| 2016/0315101 A1 | 10/2016 | Afzali-Ardakani |
| 2017/0236874 A1 | 8/2017 | Huitema |
| 2018/0083069 A1* | 3/2018 | Zeng ................... H01L 27/1251 |
| 2018/0166503 A1 | 6/2018 | Zeng |
| 2018/0211984 A1 | 7/2018 | Zeng |
| 2018/0254351 A1 | 9/2018 | Jung |

OTHER PUBLICATIONS

Office Action for European Patent Application No. 19209844.0 dated Dec. 7, 2022, 5 pgs.

\* cited by examiner

THIN-FILM-TRANSISTOR BASED COMPLEMENTARY METAL-OXIDE-SEMICONDUCTOR (CMOS) CIRCUIT

FIELD

Embodiments of the present disclosure generally relate to the field of integrated circuits, and more particularly, to transistors and semiconductor devices.

BACKGROUND

The transistor is the fundamental building block of integrated circuits (IC) and modern electronic devices, and is ubiquitous in modern electronic systems. Complementary metal-oxide-semiconductor (CMOS) is a technology for constructing integrated circuits with high noise immunity and low static power consumption based on symmetrical pair of n-type and p-type transistors. CMOS technology is used in microprocessors, microcontrollers, memory devices, and other digital logic circuits. A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs in the back-end, while leaving the silicon substrate areas for high-speed transistors. However, it may be difficult to construct TFT based CMOS circuits over a supporting substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
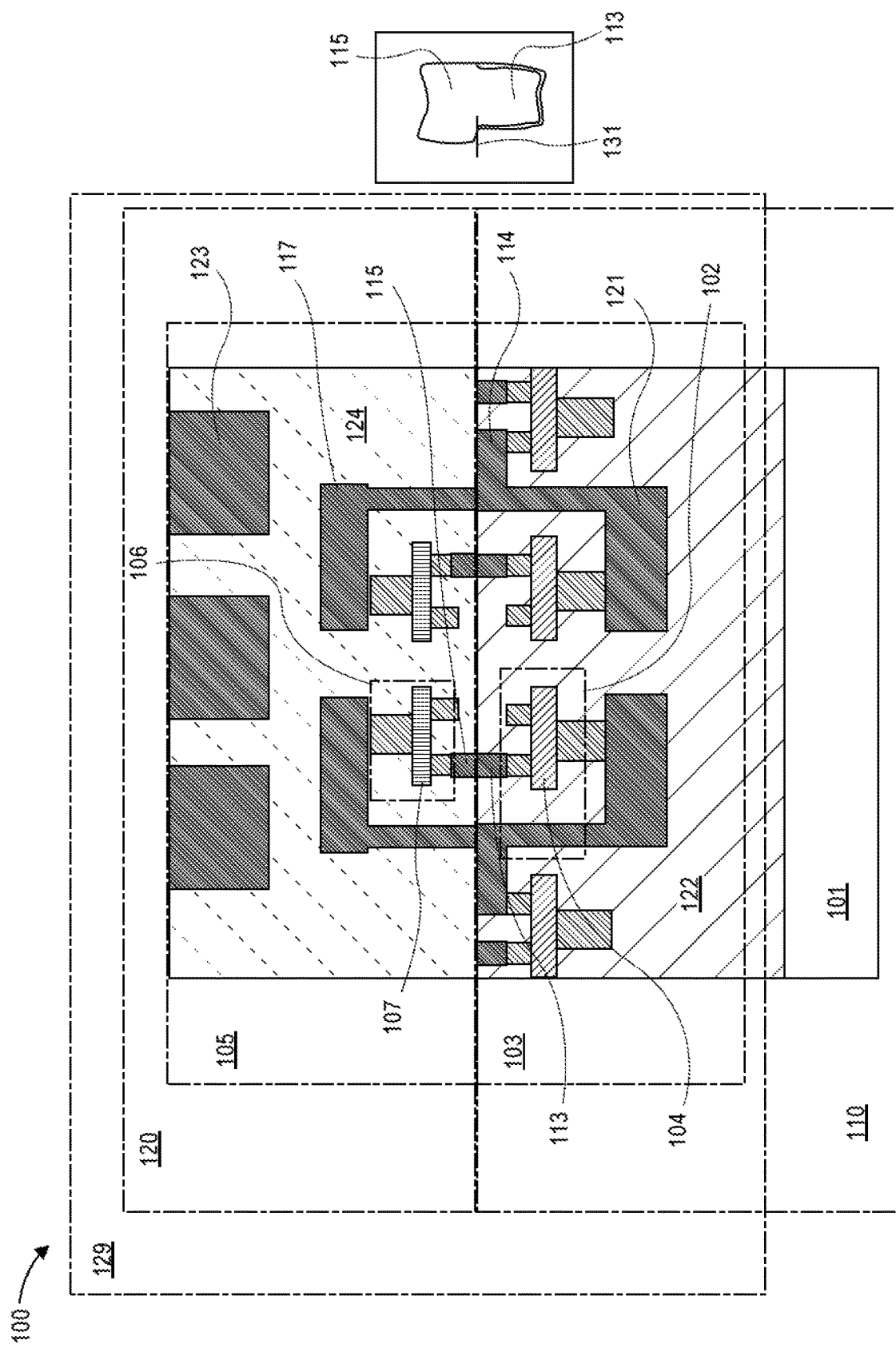
FIGS. 1(a)-1(d) schematically illustrate diagrams of semiconductor devices including a first device on a substrate of a first wafer bonded to a second device at back end of a second wafer to form a complementary metal-oxide-semiconductor (CMOS) circuit, in accordance with some embodiments.

Complementary metal-oxide-semiconductor (CMOS) is a technology for constructing integrated circuits with high noise immunity and low static power consumption based on symmetrical pair of n-type and p-type transistors. A thin-film-transistor (TFT) may be formed at the back end of an integrated circuits (IC), where a channel may be formed above a metal interconnect. However, it may be difficult to construct CMOS circuits based on TFTs. In particular, some high quality p-type TFTs may not be compatible with the backend CMOS process. Some current solutions for back-end CMOS circuits may use p-type TFTs with sub-optimal performance. For example, some CMOS circuits may use poly-Si based p-type TFTs, which may have limited integration flexibility due to high thermal budgets, resulting in high variability and high leakage of the devices.

Embodiments herein may present high quality CMOS circuits including n-type oxide TFTs with oxide semiconductor channel materials, and p-type organic TFTs with organic channel materials. P-type organic TFTs with an organic channel material may have high performance or low leakage characteristics. However, p-type organic TFTs may be typically processed at low temperatures and may exhibit limited thermal stability that may not withstand the integration temperatures of backend processing. Embodiments herein may form a first device on a substrate of a first wafer, where the first device includes an n-type oxide TFT having a first channel layer including an oxide semiconductor material. Similarly, embodiments herein may form a second device at back end of a second wafer, where the second device includes a p-type organic TFT having a second channel layer including an organic material. Afterwards, embodiments herein may bond the first device of the first wafer and the second device of the second wafer, and the n-type oxide TFT and the p-type organic TFT are bonded to form a symmetrical pair of transistors of a CMOS circuit. In some embodiments, hybrid bonding may be performed to bond the patterned metals and inter-metal dielectrics of the first device of the first wafer and the second device of the second wafer. Hence, an n-type oxide TFT and a p-type organic TFT may be integrated at the backend of the wafer to form monolithic 3D ICs. When hybrid bonding may be performed to bond the first device of the first wafer and the second device of the second wafer, there may be some misaligned interconnects. However, such misalignments may be small, e.g., in a range of about 2 um to 10 um, and may not affect the performance of the bonded CMOS circuits.

Embodiments herein may present a semiconductor device. The semiconductor device includes a semiconductor substrate, a first device of a first wafer, and a second device at back end of a second wafer, where the first device is bonded with the second device. The first device includes a first group of metal electrodes within a first dielectric layer. A first metal electrode of the first group of metal electrodes is coupled to an n-type oxide TFT over the substrate. The n-type oxide TFT has a channel layer includes an oxide semiconductor material. The second device includes a second group of metal electrodes within a second dielectric layer. A second metal electrode of the second group of metal electrodes is coupled to a p-type organic TFT. The p-type organic TFT has a channel layer including an organic material. The first dielectric layer is bonded to the second dielectric layer, and the first metal electrode is bonded to the second metal electrode. As a result, the n-type oxide TFT and the p-type organic TFT form a symmetrical pair of transistors of a CMOS circuit.

Embodiments herein may present a method for forming a semiconductor device. The method may include forming a first device on a substrate of a first wafer. The first device includes a first transistor over the substrate, and a first metal electrode within a first dielectric layer and coupled to the first transistor. The first transistor is an n-type oxide TFT having a first channel layer including an oxide semiconductor material. The method further includes forming a second device at back end of a second wafer. The second device includes a second transistor, and a second metal electrode within a second dielectric layer and coupled to the second transistor. The second transistor is a p-type organic TFT having a second channel layer including an organic material. In addition, the method includes bonding the first device of the first wafer and the second device of the second wafer, where the first dielectric layer is bonded to the second dielectric layer, and the first metal electrode is bonded to the second metal electrode. As a result, the n-type oxide TFT and the p-type organic TFT are a symmetrical pair of transistors of a CMOS circuit.

Embodiments herein may present a computing device, which may include a circuit board, and a processor or a memory device coupled to the circuit board. In more detail, the processor or the memory device includes a semiconductor device. The semiconductor device includes a semiconductor substrate, a first device of a first wafer, and a second device at back end of a second wafer, where the first device is bonded with the second device. The first device includes a first group of metal electrodes within a first dielectric layer. A first metal electrode of the first group of metal electrodes is coupled to an n-type oxide TFT over the substrate. The n-type oxide TFT has a channel layer includes an oxide semiconductor material. The second device includes a second group of metal electrodes within a second dielectric layer. A second metal electrode of the second group of metal electrodes is coupled to a p-type organic TFT. The p-type organic TFT has a channel layer including an organic material. The first dielectric layer is bonded to the second dielectric layer, and the first metal electrode is bonded to the second metal electrode. As a result, the n-type oxide TFT and the p-type organic TFT are a symmetrical pair of transistors of a CMOS circuit.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Front-end-of-line (FEOL) semiconductor processing and structures may refer to a first portion of integrated circuit (IC) fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin-film transistor (TFT) is a kind of field-effect transistor formed at BEOL and including a channel layer, a gate electrode, and source and drain electrodes, over a supporting but non-conducting substrate.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
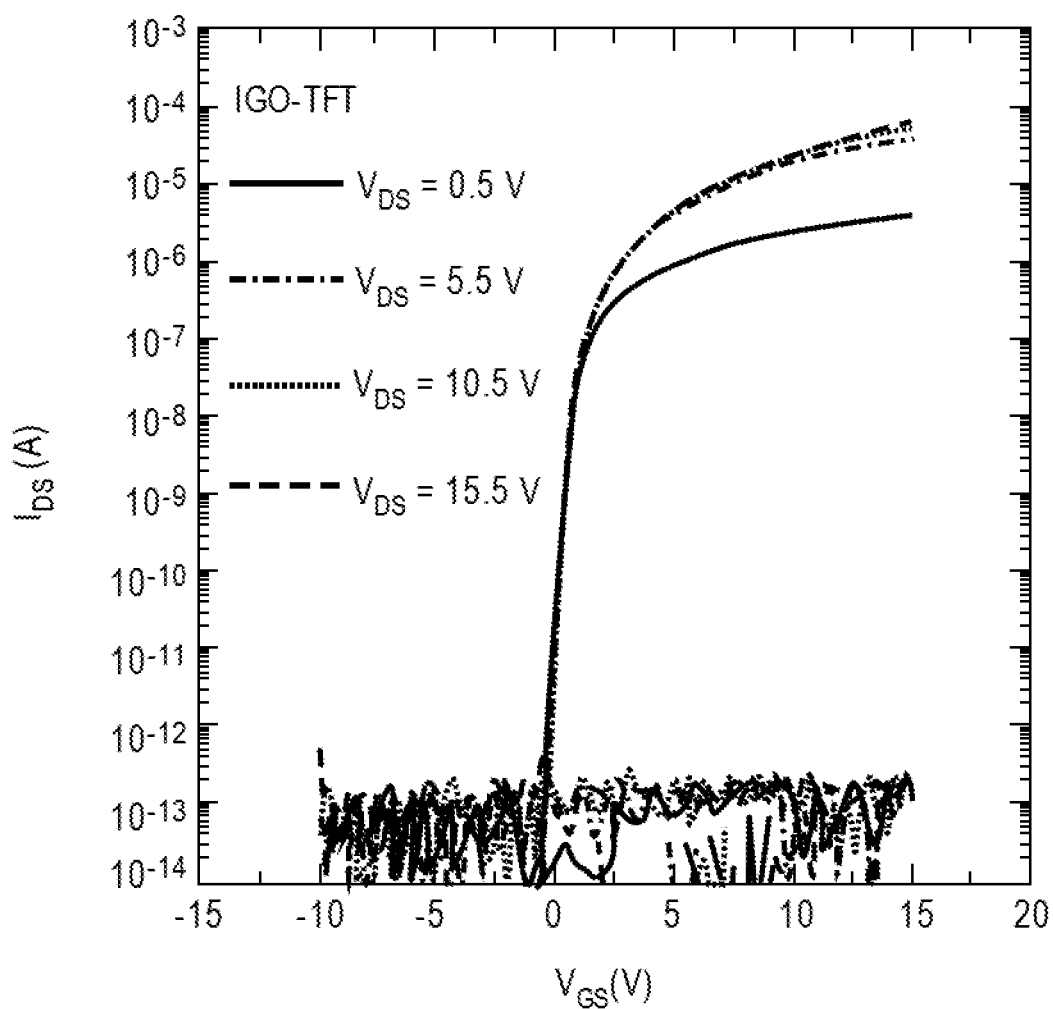
Figure 1C:
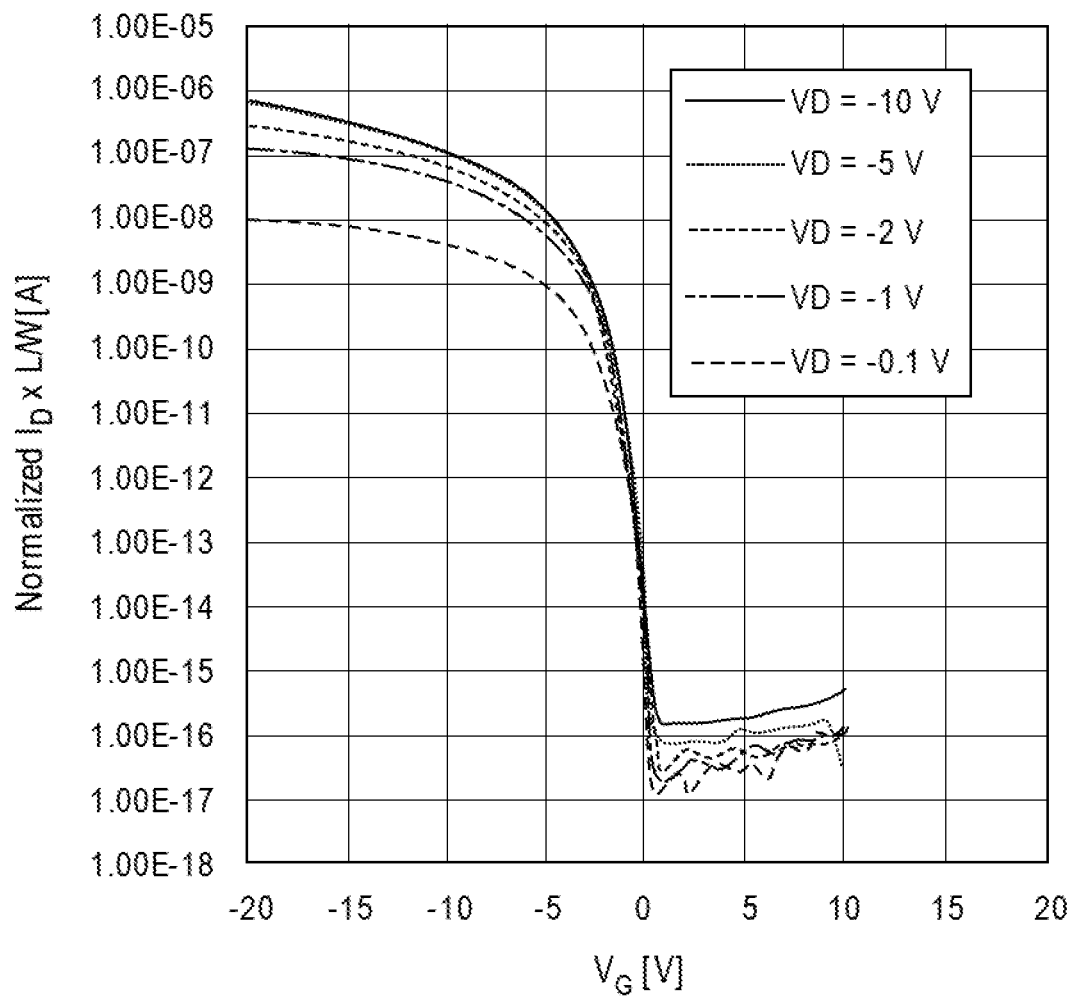
Figure 1D:
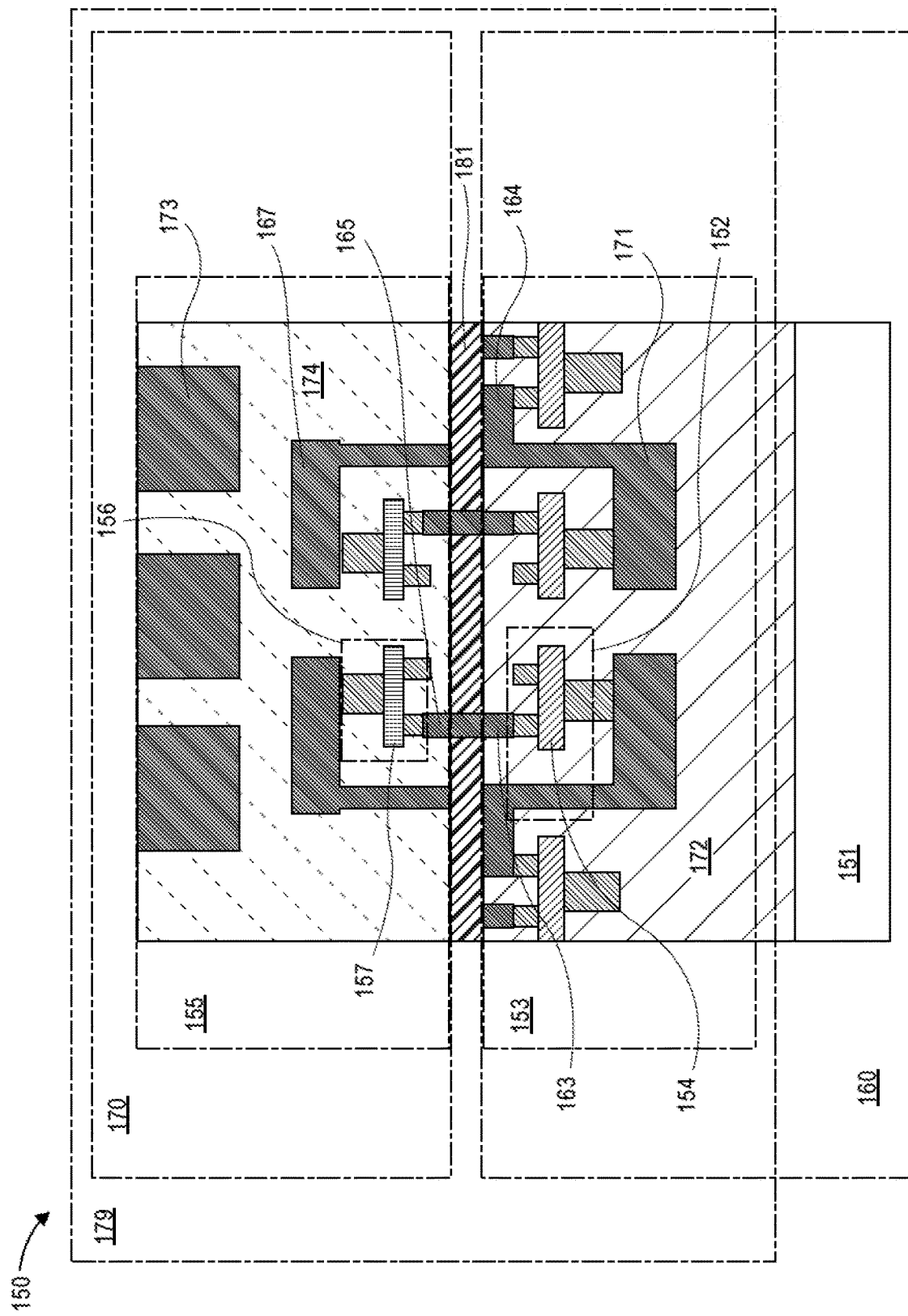

FIGS. 1(a)-1(d) schematically illustrate diagrams of semiconductor devices including a first device on a substrate of a first wafer bonded to a second device at back end of a second wafer to form a CMOS circuit, in accordance with some embodiments. For example, as shown in FIG. 1(a), a semiconductor device 100 including a first device 103 on a substrate 101 of a first wafer 110 bonded to a second device 105 at back end of a second wafer 120 to form a CMOS circuit 129. Similarly, as shown in FIG. 1(d), a semiconductor device 150 including a first device 153 on a substrate 151 of a first wafer 160 bonded to a second device 155 at back end of a second wafer 170 to form a CMOS circuit 179. For clarity, features of the semiconductor device 100, the first device 103, the substrate 101, the first wafer 110, the second device 105, the second wafer 120, and the CMOS circuit 129, or the semiconductor device 150, the first device 153, the substrate 151, the first wafer 160, the second device 155, the second wafer 170, and the CMOS circuit 179, may be described below as examples for understanding an example semiconductor device including a first device on a substrate of a first wafer bonded to a second device at back end of a second wafer to form a CMOS circuit. It is to be understood that there may be more or fewer components within of the semiconductor device 100, the first device 103, the substrate 101, the first wafer 110, the second device 105, the second wafer 120, and the CMOS circuit 129, or the semiconductor device 150, the first device 153, the substrate 151, the first wafer 160, the second device 155, the second wafer 170, and the CMOS circuit 179. Further, it is to be understood that one or more of the components within a semiconductor device including a first device on a substrate of a first wafer bonded to a second device at back end of a second wafer to form a CMOS circuit, may include additional and/or varying features from the description below, and may include any device that one having ordinary skill in the art would consider and/or refer to as a semiconductor device including a first device on a substrate of a first wafer bonded to a second device at back end of a second wafer to form a CMOS circuit.

In embodiments, as shown in FIG. 1(a), the semiconductor device 100 includes the semiconductor substrate 101, and the CMOS circuit 129 on the substrate 101. The substrate 101 may include an III-V substrate, a silicon substrate, a bulk substrate, a glass substrate, a silicon-on-insulator (SOI) substrate, or a partial-depleted SOI substrate. The CMOS circuit 129 includes the first device 103 of the first wafer 110 bonded to the second device 105 at back end of the second wafer 120. The first device 103 includes an n-type oxide TFT 102 over the substrate 101, and the second device 105 includes a p-type organic TFT 106. The n-type oxide TFT 102 and the p-type organic TFT 106 form a symmetrical pair of transistors of the CMOS circuit 129.

In embodiments, the first device 103 includes the n-type oxide TFT 102, and a first group of metal electrodes, e.g., a metal electrode 113, a metal electrode 114, a metal electrode 121, or more, within a first dielectric layer 122. The n-type oxide TFT 102 has a channel layer 104 including an oxide semiconductor material. The second device 105 is at back end of the second wafer 120. The second device 105 includes the p-type organic TFT 106; and a second group of metal electrodes, e.g., a metal electrode 115, a metal electrode 117, a metal electrode 123, or more, within a second dielectric layer 124. The p-type organic TFT 106 has a channel layer 107 including an organic material.

In embodiments, the metal electrode 113 is coupled to the n-type oxide TFT 102, while the metal electrode 115 is coupled to the p-type organic TFT 106. In detail, the metal electrode 113 or the metal electrode 115 may be coupled to a gate electrode, a source electrode, or a drain electrode of the n-type oxide TFT 102 or the p-type organic TFT 106, respectively. In addition, there may be a gate dielectric layer, not shown, between the gate electrode and the channel layer, e.g., the channel layer 104 or the channel layer 107, to separate the gate electrode from the channel layer for the n-type oxide TFT 102 or the p-type organic TFT 106.

In embodiments, the n-type oxide TFT 102 and the p-type organic TFT 106 may be bonded together to form an inverter or any other logic circuits. In detail, the first dielectric layer 122 is bonded to the second dielectric layer 124. In addition, the metal electrode 113 is bonded to the metal electrode 115. In some embodiments, the metal electrode 115 may be misaligned to the metal electrode 113 at an interface between the metal electrode 115 and second metal electrode 113. For example, there may be a misalignment 131 in a range of about 2 um to 10 um at the interface between the metal electrode 113 and the metal electrode 115.

In embodiments, the channel layer 104 of the n-type oxide TFT 102 or the channel layer 107 of the p-type organic TFT 106 includes one or more nanoribbons, nanowires, or fins. When the channel layer 104 or the channel layer 107 includes nanowires, the nanowire may be of various shapes or sizes, e.g., a rectangular prism shape, a circular shape, a triangular shape, a square shape, and a polygon shape.

In addition, the oxide semiconductor material in the channel layer 104 of the n-type oxide TFT 102 may include Zn, Ga, In, Hf, Cr, or an element selected from the group consisting of elements of Groups I, II, III and IV and elements belonging to the lanthanide series, or a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, ZnON. As shown in FIG. 1(b), the n-type oxide TFT 102 may have low leakage currents. For example, a leakage current between a source electrode and a drain electrode of the n-type oxide TFT 102 may be around a range of about $10^{-13}$ A to about $10^{-14}$ A.

In embodiments, the organic material included in the channel layer 107 of the p-type organic TFT 106 may include rubrene, tetracene, pentacene, diindenoperylene, a small molecule material, or a polymer. As shown in FIG. 1(c), the p-type organic TFT 106 may have low leakage currents. For example, a normlaized leakage current between a source electrode and a drain electrode of the p-type organic TFT 106 may be around a range of $10^{-16}$ A to $10^{-17}$ A.

In embodiments, a metal electrode of the first group of metal electrodes, e.g., the metal electrode 113, the metal electrode 114, the metal electrode 121, or the second group of metal electrodes, e.g., the metal electrode 115, the metal electrode 117, the metal electrode 123, includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO. In some other embodiments, a metal electrode of the first group of metal electrodes or the second group of metal electrodes may be a stack including multiple layers, and may include a metal layer, and a metal sealant layer adjacent to the metal layer.

There may be various embodiments for semiconductor devices including a first device on a substrate of a first wafer bonded to a second device at back end of a second wafer to form a CMOS circuit. For example, as shown in FIG. 1(d), the semiconductor device 150 includes the first device 153 on the substrate 151 of the first wafer 160 bonded to the second device 155 at back end of a second wafer 170 to form the CMOS circuit 179. Many components of the first device 153 and the second device 155 may be similar to the first device 103 and the second device 105, as shown in FIG. 1(a), where the descriptions of the corresponding components may apply for the first device 153 and the second device 155.

In embodiments, the CMOS circuit 179 includes the first device 153 of the first wafer 160 bonded to the second device 155 at back end of the second wafer 170. The first device 153 includes an n-type oxide TFT 152 over the substrate 151, and a p-type organic TFT 156. The n-type oxide TFT 152 and the p-type organic TFT 156 form a symmetrical pair of transistors of the CMOS circuit 179.

In embodiments, the first device 153 includes a first group of metal electrodes, e.g., a metal electrode 163, a metal electrode 164, a metal electrode 171, within a first dielectric layer 172. The n-type oxide TFT 152 has a channel layer 154 including an oxide semiconductor material. The second device 155 is at back end of the second wafer 170. The second device 155 includes the p-type organic TFT 156; and a second group of metal electrodes, e.g., a metal electrode 165, a metal electrode 167, a metal electrode 173, within a second dielectric layer 174. The p-type organic TFT 156 has a channel layer 157 including an organic material. The metal electrode 163 is coupled to the n-type oxide TFT 152, while the metal electrode 165 is coupled to the p-type organic TFT 156.

In embodiments, the first device 153 and the second device 155 may be bonded together through a glue layer 181 between the first dielectric layer 172 and the second dielectric layer 174. Hence, the n-type oxide TFT 152 and the p-type organic TFT 156 may be bonded together to form an inverter or any other logic circuits. In detail, the first dielectric layer 172 is bonded to the second dielectric layer 174. In addition, the metal electrode 163 is bonded to the metal electrode 165. In embodiments, the glue layer 181 may include polymers flare, methylsilsesquioxane, bis-benzocyclobutene (BCB), hydrogen silsesquioxane (HSQ), or polymer parylene-N. The first device 153 and the second device 155 may be bonded by hyper bonding to combine metal-to-metal bonding and wafer bonding with organic adhesive or inorganic dielectric. For example, the metal-to-metal bonding may be Cu—Cu diffusion bonding.

Figure 2A:
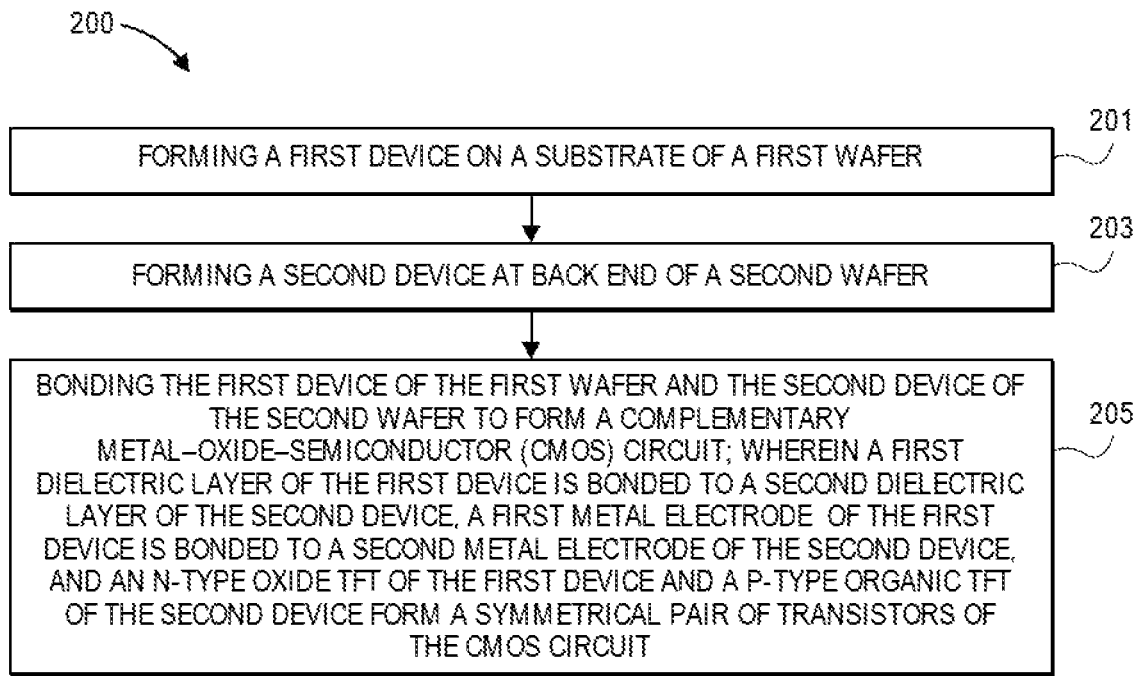
FIGS. 2(a)-2(b) schematically illustrate a process for forming a semiconductor device including a first device on a substrate of a first wafer bonded to a second device at back end of a second wafer to form a CMOS circuit, in accordance with some embodiments.
Figure 2B:
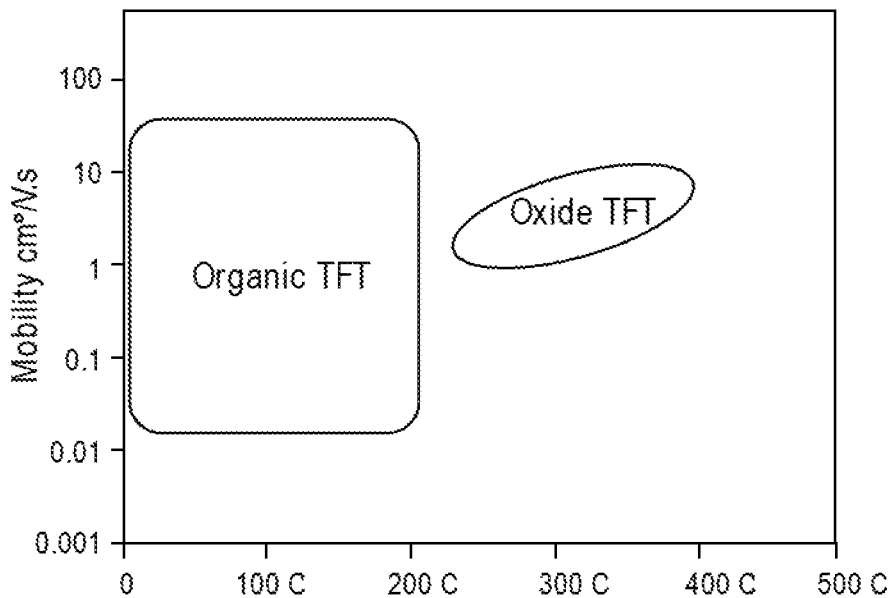
Figure 3A:
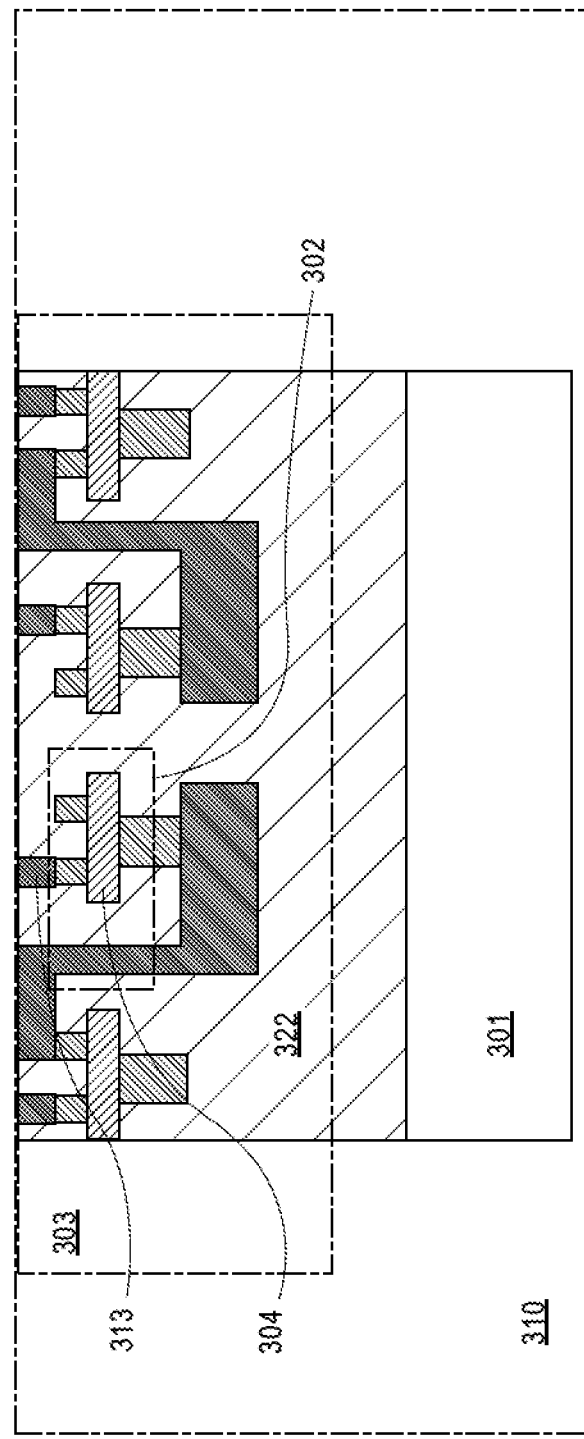
FIGS. 3(a)-3(c) schematically illustrate a process for forming a semiconductor device including a first device on a substrate of a first wafer bonded to a second device at back end of a second wafer to form a CMOS circuit, in accordance with some embodiments.
Figure 3B:
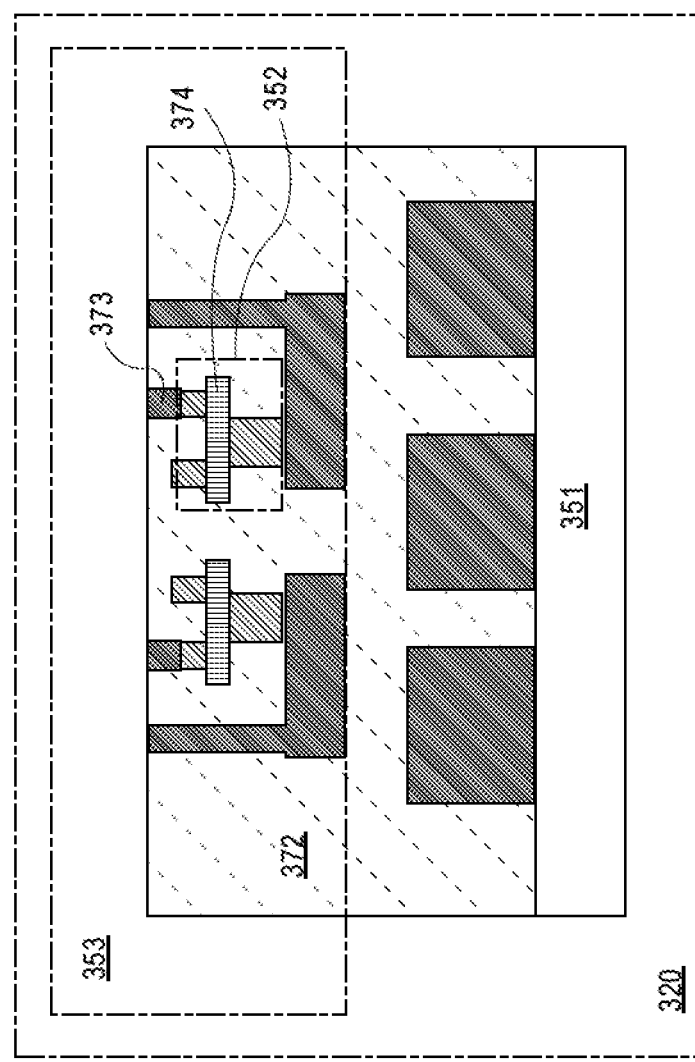
Figure 3C:
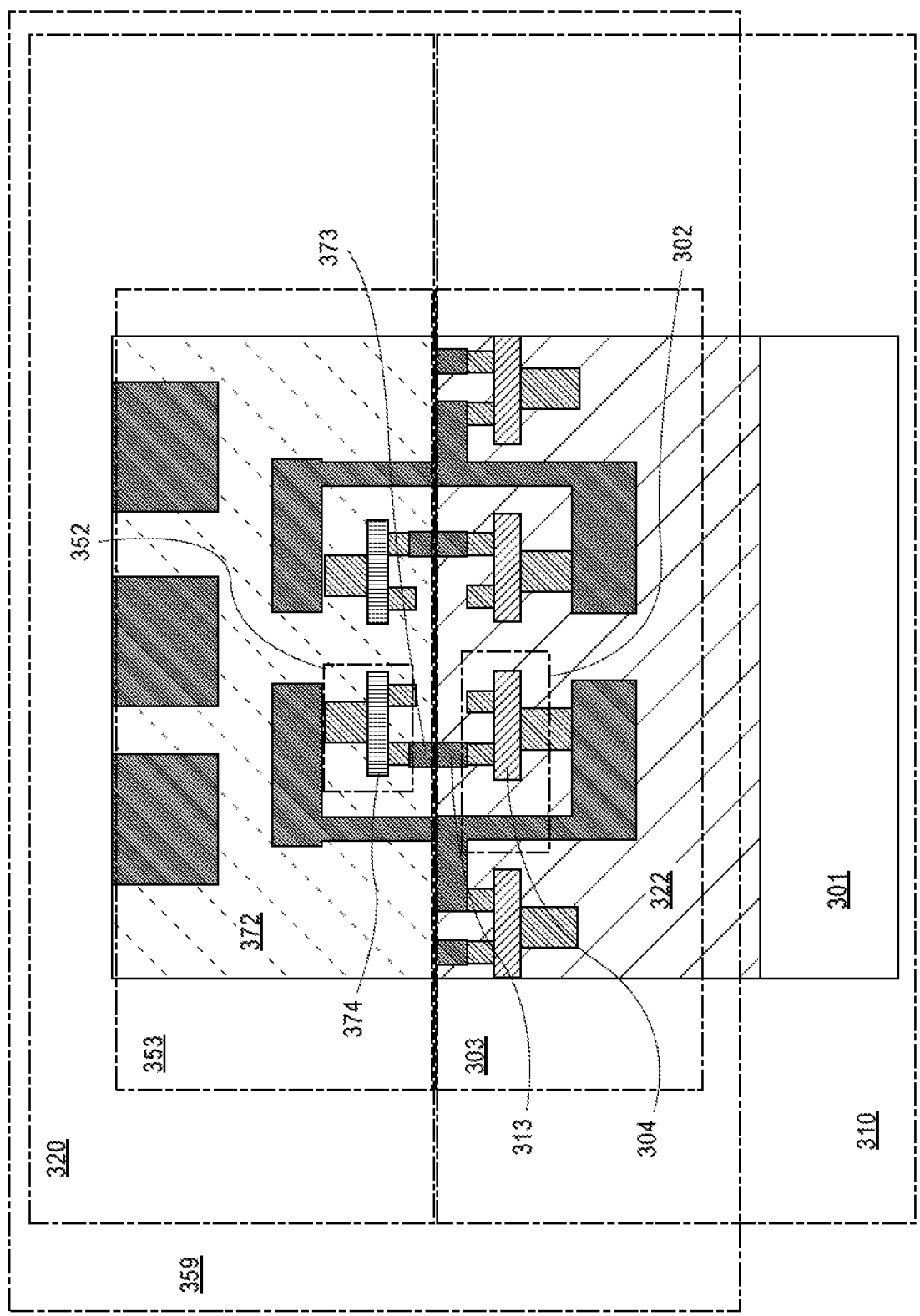

FIGS. 2(a)-2(b) schematically illustrate a process 200 for forming a semiconductor device including a first device on a substrate of a first wafer bonded to a second device at back end of a second wafer to form a CMOS circuit, in accordance with some embodiments. More details of the process 200 are illustrated in FIGS. 3(a)-3(c). In embodiments, the process 200 may be applied to form the semiconductor device 100 or the semiconductor device 150, as shown in FIGS. 1(a)-1(d).

At block 201, the process 200 may include forming a first device on a substrate of a first wafer. The first device includes a first transistor over the substrate, and a first metal electrode within a first dielectric layer and coupled to the first transistor. The first transistor is an n-type oxide TFT having a first channel layer including an oxide semiconductor material. For example, as shown in FIG. 3(a), the process 200 may include forming a first device 303 on a substrate 301 of a first wafer 310. The first device 303 includes a first TFT 302 over the substrate 301, and a first metal electrode 313 within a first dielectric layer 322 and coupled to the first TFT 302. The first TFT 302 is an n-type oxide TFT having a channel layer 304 including an oxide semiconductor material. Based on the information shown in FIG. 2(b), the first device 303 may be formed in a temperature in a range of about 200 C to about 500 C.

At block 203, the process 200 may include forming a second device at back end of a second wafer. The second device includes a second transistor, and a second metal electrode within a second dielectric layer and coupled to the second transistor. The second transistor is a p-type organic TFT having a second channel layer including an organic material. For example, as shown in FIG. 3(b), the process 200 may include forming a second device 353 at back end of a second wafer 320. The second device 353 includes a second TFT 352, and a second metal electrode 373 within a second dielectric layer 372 and coupled to the TFT 352. The second TFT 352 is a p-type organic TFT having a second channel layer 374 including an organic material. Based on the information shown in FIG. 2(b), the second device 353 may be formed in a temperature less than about 250 C.

At block 205, the process 200 may include bonding the first device of the first wafer and the second device of the second wafer to form a CMOS circuit. A first dielectric layer of the first device is bonded to a second dielectric layer of the second device, while a first metal electrode of the first device is bonded to a second metal electrode of the second device. In addition, an n-type oxide TFT of the first device and a p-type organic TFT of the second device form a symmetrical pair of transistors of the CMOS circuit. For example, as shown in FIG. 3(c), the process 200 may include bonding the first device 303 of the first wafer 310 and the second device 353 of the second wafer 320 to form a CMOS circuit 359. The first dielectric layer 322 of the first device 303 is bonded to the second dielectric layer 372 of the second device 353, while the first metal electrode 313 of the first device 303 is bonded to the second metal electrode 373 of the second device 353. In addition, the n-type oxide TFT 302 of the first device 303 and the p-type organic TFT 352 of the second device 353 form a symmetrical pair of transistors of the CMOS circuit 359. In embodiments, the bonding the first device 303 of the first wafer 310 and the second device 353 of the second wafer 320 may be performed by hyper bonding to combine metal-to-metal bonding and wafer bonding with organic adhesive or inorganic dielectric. For example, the first metal electrode 313 of the first device 303 and the second metal electrode 373 of the second device 353 may be bonded by Cu—Cu diffusion bonding.

In addition, not shown, the process 200 may include additional operations to form other layers. For example, the process 200 may include forming a glue layer between the first dielectric layer 322 and the second dielectric layer 372 to bond the first dielectric layer 322 and the second dielectric layer 372 together, and between the first metal electrode 313 and the second metal electrode 373 to bond the first metal electrode 313 and the second metal electrode 373 together. The glue layer includes polymers flare, methylsilsesquioxane, bis-benzocyclobutene (BCB), hydrogen silsesquioxane (HSQ), or polymer parylene-N.

Figure 4:
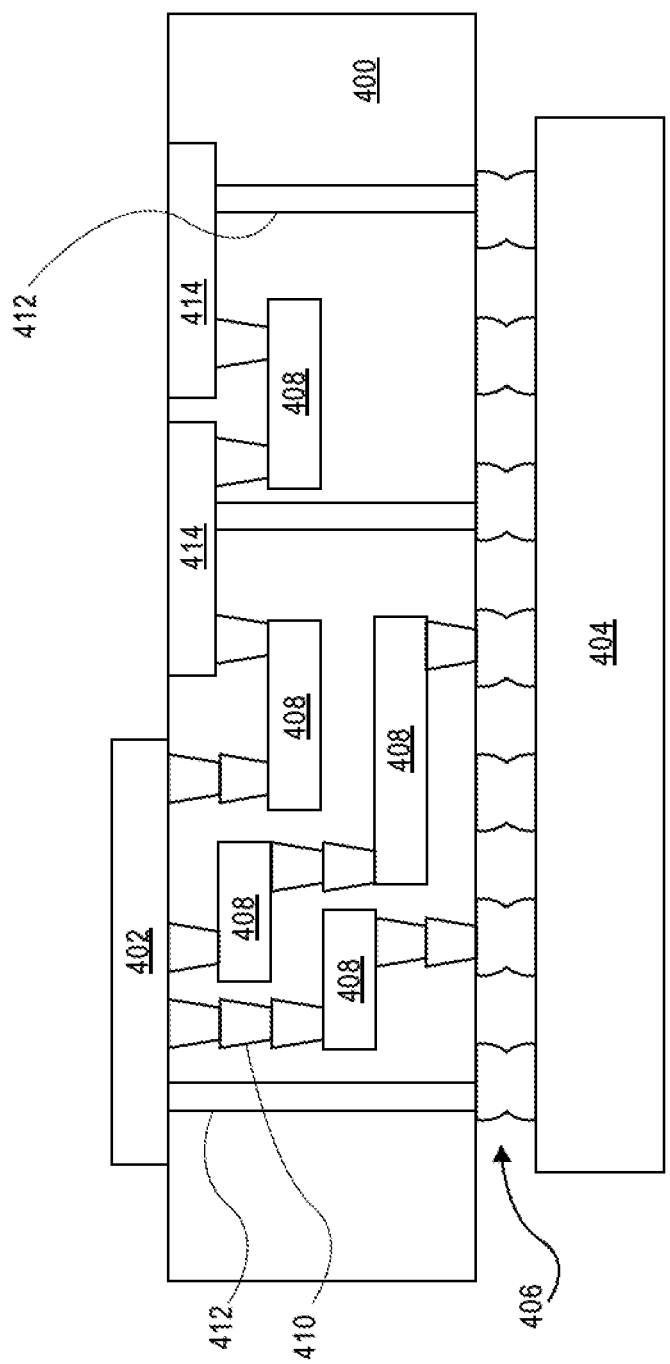
FIG. 4 schematically illustrates an interposer implementing one or more embodiments of the disclosure, in accordance with some embodiments.

FIG. 4 illustrates an interposer 400 that includes one or more embodiments of the disclosure. The interposer 400 is an intervening substrate used to bridge a first substrate 402 to a second substrate 404. The first substrate 402 may be, for instance, a substrate support for a semiconductor device, e.g., the semiconductor device 100, the semiconductor device 150 in FIGS. 1(a)-1(d), or a semiconductor device formed following the process 200 shown in FIG. 2. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the disclosure, apparatuses or processes disclosed herein may be used in the fabrication of interposer 400.

Figure 5:
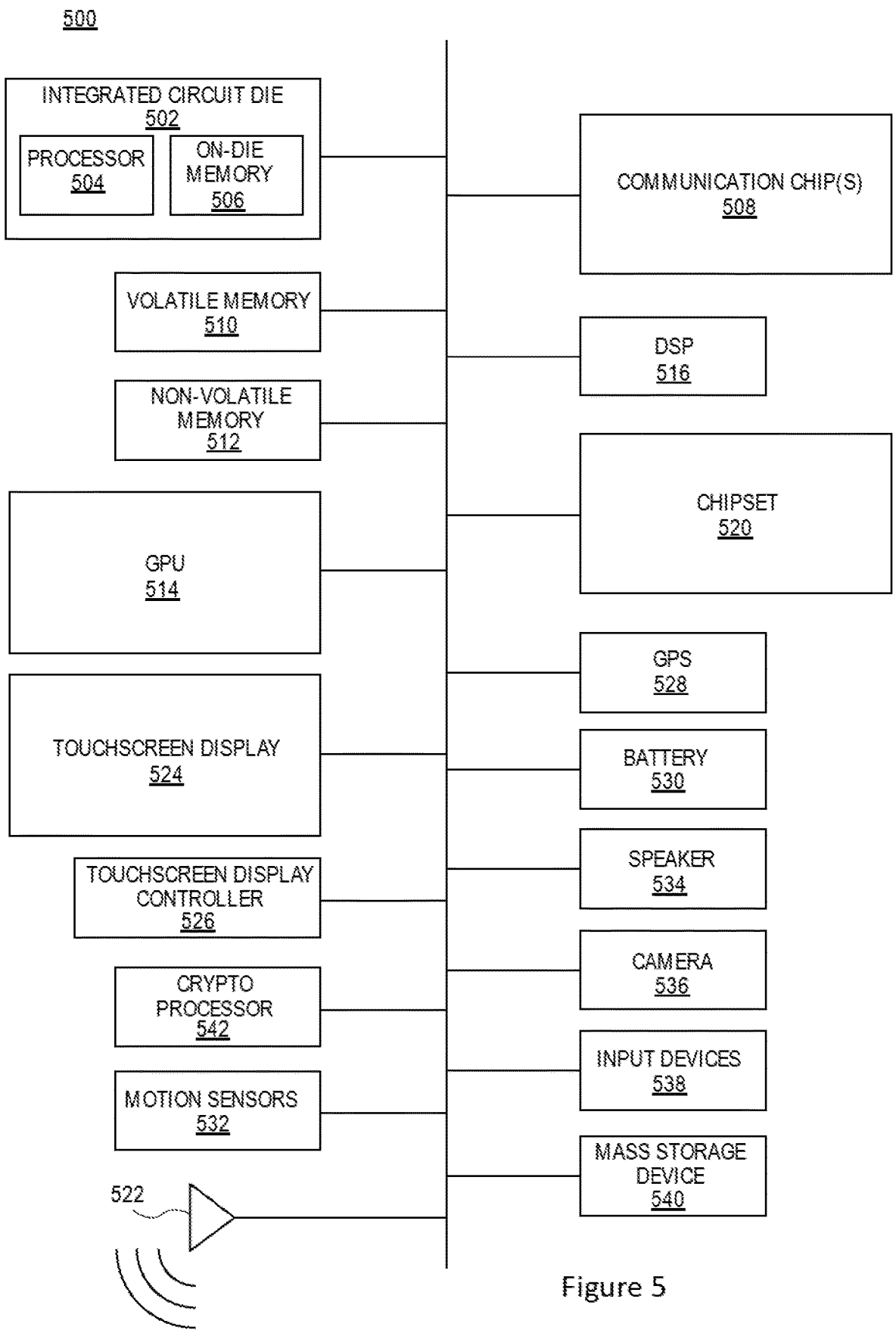
FIG. 5 schematically illustrates a computing device built in accordance with an embodiment of the disclosure, in accordance with some embodiments.

FIG. 5 illustrates a computing device 500 in accordance with one embodiment of the disclosure. The computing device 500 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a processor 504 as well as on-die memory 506, often used as cache memory, which can be provided by technologies such as embedded DRAM (eDRAM), or SRAM. For example, the processor 504 as well as the on-die memory 506 may include the semiconductor device 100, the semiconductor device 150 in FIGS. 1(a)-1(d), or a semiconductor device formed following the process 200 shown in FIG. 2.

In embodiments, the computing device 500 may include a display or a touchscreen display 524, and a touchscreen display controller 526. A display or the touchscreen display 524 may include a FPD, an AMOLED display, a TFT LCD, a micro light-emitting diode (µLED) display, or others.

Computing device 500 may include other components that may or may not be physically and electrically coupled to the motherboard or fabricated within a SoC die. These other components include, but are not limited to, volatile memory 510 (e.g., dynamic random access memory (DRAM), non-volatile memory 512 (e.g., ROM or flash memory), a graphics processing unit 514 (GPU), a digital signal processor (DSP) 516, a crypto processor 542 (e.g., a specialized processor that executes cryptographic algorithms within hardware), a chipset 520, at least one antenna 522 (in some implementations two or more antenna may be used), a battery 530 or other power source, a power amplifier (not shown), a voltage regulator (not shown), a global positioning system (GPS) device 528, a compass, a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as transistors. The term "processor" may refer to any device or portion of a device that processes electronic data from registers and/or memory to transform that electronic data into other electronic data that may be stored in registers and/or memory. The communications logic unit 508 may also include one or more devices, such as transistors.

In further embodiments, another component housed within the computing device 500 may contain one or more devices, such as DRAM, that are formed in accordance with implementations of the current disclosure, e.g., the semiconductor device 100, the semiconductor device 150 in FIGS. 1(a)-1(d), or a semiconductor device formed following the process 200 shown in FIG. 2.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some Non-Limiting Examples are Provided Below

Example 1 may include a semiconductor device, comprising: a substrate; a first device including a first group of metal electrodes within a first dielectric layer, wherein a first metal electrode of the first group of metal electrodes is coupled to an n-type oxide thin-film-transistor (TFT) over the substrate, the n-type oxide TFT has a channel layer including an oxide semiconductor material, and the substrate and the first device are a part of a first wafer; a second device including a second group of metal electrodes within a second dielectric layer, wherein a second metal electrode of the second group of metal electrodes is coupled to a p-type organic TFT, the p-type organic TFT has a channel layer including an organic material, and the second device is at back end of a second wafer; wherein the first dielectric layer is bonded to the second dielectric layer; the first metal electrode is bonded to the second metal electrode; and the n-type oxide TFT and the p-type organic TFT are a symmetrical pair of transistors of a complementary metal-oxide-semiconductor (CMOS) circuit.

Example 2 may include the semiconductor device of example 1 and/or some other examples herein, wherein the organic material included in the channel layer of the p-type organic TFT includes rubrene, tetracene, pentacene, diindenoperylene, a small molecule material, or a polymer.

Example 3 may include the semiconductor device of example 1 and/or some other examples herein, wherein the oxide semiconductor material in the channel layer of the n-type oxide TFT includes: Zn, Ga, In, Hf, Cr, or an element selected from the group consisting of elements of Groups I, II, III and IV and elements belonging to the lanthanide series, or a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, ZnON.

Example 4 may include the semiconductor device of example 1 and/or some other examples herein, wherein the channel layer of the n-type oxide TFT or the channel layer of the p-type organic TFT includes one or more nanoribbons, nanowires, or fins.

Example 5 may include the semiconductor device of example 1 and/or some other examples herein, wherein the first metal electrode is misaligned to the second metal electrode at an interface between the first metal electrode and the second metal electrode.

Example 6 may include the semiconductor device of example 5 and/or some other examples herein, wherein the interface between the first metal electrode and the second metal electrode has a misalignment in a range of about 2 um to 10 um.

Example 7 may include the semiconductor device of example 1 and/or some other examples herein, further comprising: a glue layer between the first dielectric layer and the second dielectric layer to bond the first dielectric layer and the second dielectric layer together, and between the first metal electrode and the second metal electrode to bond the first metal electrode and the second metal electrode together.

Example 8 may include the semiconductor device of example 7 and/or some other examples herein, wherein the glue layer includes polymers flare, methylsilsesquioxane, bis-benzocyclobutene (BCB), hydrogen silsesquioxane (HSQ), or polymer parylene-N.

Example 9 may include the semiconductor device of example 1 and/or some other examples herein, wherein the first metal electrode of the first group of metal electrodes or the second metal electrode of the second group of metal electrodes is coupled to a gate electrode, a source electrode, or a drain electrode of the n-type oxide TFT or the p-type organic TFT.

Example 10 may include the semiconductor device of example 1 and/or some other examples herein, wherein a metal electrode of the first group of metal electrodes or the second group of metal electrodes includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 11 may include the semiconductor device of example 1 and/or some other examples herein, wherein the substrate includes an III-V substrate, a silicon substrate, a bulk substrate, a glass substrate, a silicon-on-insulator (SOI) substrate, or a partial-depleted SOI substrate.

Example 12 may include a method for forming a semiconductor device, the method comprising: forming a first device on a substrate of a first wafer, wherein the first device includes a first transistor over the substrate, and a first metal electrode within a first dielectric layer and coupled to the first transistor, the first transistor is an n-type oxide thin-film-transistor (TFT) having a first channel layer including an oxide semiconductor material; forming a second device at back end of a second wafer, wherein the second device includes a second transistor, and a second metal electrode within a second dielectric layer and coupled to the second transistor, the second transistor is a p-type organic TFT having a second channel layer including an organic material; and bonding the first device of the first wafer and the second device of the second wafer; wherein the first dielectric layer is bonded to the second dielectric layer, the first metal electrode is bonded to the second metal electrode, and the n-type oxide TFT and the p-type organic TFT are a symmetrical pair of transistors of a complementary metal-oxide-semiconductor (CMOS) circuit.

Example 13 may include the method of example 12 and/or some other examples herein, further comprising: forming a glue layer between the first dielectric layer and the second dielectric layer to bond the first dielectric layer and the second dielectric layer together, and between the first metal electrode and the second metal electrode to bond the first metal electrode and the second metal electrode together.

Example 14 may include the method of example 13 and/or some other examples herein, wherein the glue layer includes polymers flare, methylsilsesquioxane, bis-benzocyclobutene (BCB), hydrogen silsesquioxane (HSQ), or polymer parylene-N.

Example 15 may include the method of example 12 and/or some other examples herein, wherein the forming the first device includes forming the first device in a temperature in a range of about 200 C to about 500 C.

Example 16 may include the method of example 12 and/or some other examples herein, wherein the forming the second device includes forming the second device in a temperature less than about 250 C.

Example 17 may include the method of example 12 and/or some other examples herein, wherein the bonding the first device of the first wafer and the second device of the second wafer includes hyper bonding to combine metal-to-metal bonding and wafer bonding with organic adhesive or inorganic dielectric.

Example 18 may include the method of example 17 and/or some other examples herein, wherein the metal-to-metal bonding includes Cu—Cu diffusion bonding.

Example 19 may include the method of example 12 and/or some other examples herein, wherein the organic material included in the second channel layer of the second transistor includes rubrene, tetracene, pentacene, diindenoperylene, a small molecule material, or a polymer.

Example 20 may include the method of example 12 and/or some other examples herein, wherein the oxide semiconductor material in the first channel layer of the first transistor includes: Zn, Ga, In, Hf, Cr, or an element selected from the group consisting of elements of Groups I, II, III and IV and elements belonging to the lanthanide series, or a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, ZnON.

Example 21 may include a computing device, comprising: a circuit board; and a processor or a memory device coupled to the circuit board, wherein the processor or the memory device includes a semiconductor device, wherein the semiconductor device comprises: a substrate; a first device including a first group of metal electrodes within a first dielectric layer, wherein a first metal electrode of the first group of metal electrodes is coupled to an n-type oxide thin-film-transistor (TFT) over the substrate, the n-type oxide TFT has a channel layer including an oxide semiconductor material, and the substrate and the first device are a part of a first wafer; a second device including a second group of metal electrodes within a second dielectric layer, wherein a second metal electrode of the second group of metal electrodes is coupled to a p-type organic TFT, the p-type organic TFT has a channel layer including an organic material, and the second device is at back end of a second wafer; wherein the first dielectric layer is bonded to the second dielectric layer; the first metal electrode is bonded to the second metal electrode; and the n-type oxide TFT and the p-type organic TFT are a symmetrical pair of transistors of a complementary metal-oxide-semiconductor (CMOS) circuit.

Example 22 may include computing device of example 21 and/or some other examples herein, wherein the organic material included in the channel layer of the p-type organic TFT includes rubrene, tetracene, pentacene, diindenoperylene, a small molecule material, or a polymer.

Example 23 may include computing device of example 21 and/or some other examples herein, wherein the oxide semiconductor material in the n-type oxide TFT includes: Zn, Ga, In, Hf, Cr, or an element selected from the group consisting of elements of Groups I, II, III and IV and elements belonging to the lanthanide series, or a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, ZnON.

Example 24 may include computing device of example 21 and/or some other examples herein, wherein the first metal electrode is misaligned to the second metal electrode at an interface between the first metal electrode and the second metal electrode, and the interface between the first metal electrode and the second metal electrode has a misalignment in a range of about 2 um to 10 um.

Example 25 may include computing device of example 21 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a substrate;
a first device including a first group of metal electrodes within a first dielectric layer, wherein a first metal electrode of the first group of metal electrodes is coupled to an n-type oxide thin-film-transistor (TFT) over the substrate, the n-type oxide TFT has a channel layer including an oxide semiconductor material, and the substrate and the first device are a part of a first wafer;
a second device including a second group of metal electrodes within a second dielectric layer, wherein a second metal electrode of the second group of metal electrodes is coupled to a p-type organic TFT, the p-type organic TFT has a channel layer including an organic material, and the second device is at a back end of a second wafer;
wherein the first dielectric layer is bonded directly to the second dielectric layer; the first metal electrode is bonded directly to the second metal electrode; and the n-type oxide TFT and the p-type organic TFT are a pair of transistors of a complementary metal-oxide-semiconductor (CMOS) circuit.

2. The semiconductor device of claim 1, wherein the organic material included in the channel layer of the p-type organic TFT includes rubrene, tetracene, pentacene, diindenoperylene, or a polymer.

3. The semiconductor device of claim 1, wherein the oxide semiconductor material in the channel layer of the n-type oxide TFT includes:
Zn, Ga, In, Hf, Cr, or
an element selected from the group consisting of elements of Groups I, II, III and IV and elements belonging to the lanthanide series, or
a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, and ZnON.

4. The semiconductor device of claim 1, wherein the channel layer of the n-type oxide TFT or the channel layer of the p-type organic TFT includes one or more nanoribbons, nanowires, or fins.

5. The semiconductor device of claim 1, wherein the first metal electrode is misaligned to the second metal electrode at an interface between the first metal electrode and the second metal electrode.

6. The semiconductor device of claim 5, wherein the interface between the first metal electrode and the second metal electrode has a misalignment in a range of about 2 um to 10 um.

7. The semiconductor device of claim 1, wherein the first metal electrode of the first group of metal electrodes or the second metal electrode of the second group of metal electrodes is coupled to a gate electrode, a source electrode, or a drain electrode of the n-type oxide TFT or the p-type organic TFT.

8. The semiconductor device of claim 1, wherein a metal electrode of the first group of metal electrodes or the second group of metal electrodes includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

9. The semiconductor device of claim 1, wherein the substrate includes an III-V substrate, a silicon substrate, a bulk substrate, a glass substrate, a silicon-on-insulator (SOI) substrate, or a partial-depleted SOI substrate.

10. A method for forming a semiconductor device, the method comprising:
forming a first device on a substrate of a first wafer, wherein the first device includes a first transistor over the substrate, and a first metal electrode within a first dielectric layer and coupled to the first transistor, the first transistor is an n-type oxide thin-film-transistor (TFT) having a first channel layer including an oxide semiconductor material;
forming a second device at a back end of a second wafer, wherein the second device includes a second transistor, and a second metal electrode within a second dielectric layer and coupled to the second transistor, the second transistor is a p-type organic TFT having a second channel layer including an organic material; and
directly bonding the first device of the first wafer and the second device of the second wafer; wherein the first dielectric layer is bonded directly to the second dielectric layer, the first metal electrode is bonded directly to the second metal electrode, and the n-type oxide TFT and the p-type organic TFT are a pair of transistors of a complementary metal-oxide-semiconductor (CMOS) circuit.

11. The method of claim 10, wherein the forming the first device includes forming the first device in a temperature in a range of about 200 C to about 500 C.

12. The method of claim 10, wherein the forming the second device includes forming the second device in a temperature less than about 250 C.

13. The method of claim 10, wherein the directly bonding the first device of the first wafer and the second device of the second wafer includes hyper bonding to combine metal-to-metal bonding and wafer bonding with inorganic dielectrics.

14. The method of claim 13, wherein the metal-to-metal bonding includes Cu—Cu diffusion bonding.

15. The method of claim 10, wherein the organic material included in the second channel layer of the second transistor includes rubrene, tetracene, pentacene, diindenoperylene, or a polymer.

16. The method of claim 10, wherein the oxide semiconductor material in the first channel layer of the first transistor includes:
Zn, Ga, In, Hf, Cr, or
an element selected from the group consisting of elements of Groups I, II, III and IV and elements belonging to the lanthanide series, or
a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, and ZnON.

17. A computing device, comprising:
a circuit board; and
a processor or a memory device coupled to the circuit board, wherein the processor or the memory device includes a semiconductor device, wherein the semiconductor device comprises:
a substrate;
a first device including a first group of metal electrodes within a first dielectric layer, wherein a first metal electrode of the first group of metal electrodes is coupled to an n-type oxide thin-film-transistor (TFT) over the substrate, the n-type oxide TFT has a channel layer including an oxide semiconductor material, and the substrate and the first device are a part of a first wafer;
a second device including a second group of metal electrodes within a second dielectric layer, wherein a second metal electrode of the second group of metal electrodes is coupled to a p-type organic TFT, the p-type organic TFT has a channel layer including an organic material, and the second device is at a back end of a second wafer;
wherein the first dielectric layer is bonded directly to the second dielectric layer;
the first metal electrode is bonded directly to the second metal electrode; and the n-type oxide TFT and the p-type organic TFT are a pair of transistors of a complementary metal-oxide-semiconductor (CMOS) circuit.

18. The computing device of claim 17, wherein the organic material included in the channel layer of the p-type organic TFT includes rubrene, tetracene, pentacene, diindenoperylene, or a polymer.

19. The computing device of claim 17, wherein the oxide semiconductor material in the n-type oxide TFT includes:
Zn, Ga, In, Hf, Cr, or
an element selected from the group consisting of elements of Groups I, II, III and IV and elements belonging to the lanthanide series, or
a material selected from the group consisting of indium doped zinc oxide (IZO), zinc tin oxide (ZTO), yttrium-doped zinc oxide (YZO), poly germanium doped with arsenic, indium oxide, tin oxide, zinc oxide, gallium oxide, indium gallium zinc oxide (IGZO), copper oxide, nickel oxide, cobalt oxide, indium tin oxide, amorphous InGaZnO (a-IGZO), crystal-like InGaZnO (c-IGZO), GaZnON, and ZnON.

20. The computing device of claim 17, wherein the first metal electrode is misaligned to the second metal electrode at an interface between the first metal electrode and the second metal electrode, and the interface between the first metal electrode and the second metal electrode has a misalignment in a range of about 2 um to 10 um.

21. The computing device of claim 17, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *